United States Patent
Oya et al.

(10) Patent No.: US 6,715,944 B2
(45) Date of Patent: Apr. 6, 2004

(54) APPARATUS FOR REMOVING PHOTORESIST FILM

(75) Inventors: Izumi Oya, Tokyo (JP); Seiji Noda, Tokyo (JP); Makoto Miyamoto, Tokyo (JP); Masaki Kuzumoto, Tokyo (JP); Masashi Ohmori, Shizuoka (JP); Tatsuo Kataoka, Shizuoka (JP)

(73) Assignees: Mitsubishi Denki Kabushiki Kaisha, Tokyo (JP); Shimada Rika Kougyo Kabushiki Kaisha, Shizuoka (JP)

( * ) Notice: Subject to any disclaimer, the term of this patent is extended or adjusted under 35 U.S.C. 154(b) by 0 days.

(21) Appl. No.: 10/134,481

(22) Filed: Apr. 30, 2002

(65) Prior Publication Data

US 2002/0115024 A1 Aug. 22, 2002

Related U.S. Application Data

(62) Division of application No. 09/614,258, filed on Jul. 12, 2000, now Pat. No. 6,517,999, which is a continuation of application No. PCT/JP99/06323, filed on Nov. 12, 1999.

(30) Foreign Application Priority Data

Nov. 12, 1998 (JP) .......................................... P10-321876

(51) Int. Cl.[7] .............................. G03D 3/02; G03D 3/04
(52) U.S. Cl. ...................... 396/626; 396/628; 396/633; 134/902
(58) Field of Search ................................ 396/617, 626, 396/628, 629, 633; 355/27; 430/329.3; 134/1.3, 902

(56) References Cited

U.S. PATENT DOCUMENTS

| | | | |
|---|---|---|---|
| 4,812,201 A | 3/1989 | Sakai et al. | |
| 5,378,317 A | * 1/1995 | Kashiwase et al. | 438/704 |
| 5,464,480 A | 11/1995 | Matthews | |
| 5,503,708 A | * 4/1996 | Koizumi et al. | 438/708 |
| 5,911,837 A | * 6/1999 | Matthews | 134/2 |
| 5,964,954 A | * 10/1999 | Matsukawa et al. | 134/6 |
| 6,080,531 A | 6/2000 | Carter et al. | |
| 6,273,108 B1 | 8/2001 | Bergman et al. | |

FOREIGN PATENT DOCUMENTS

| | | |
|---|---|---|
| JP | 5-152270 | 6/1993 |
| JP | 9-213617 | 8/1997 |
| JP | 2000-195833 | 7/2000 |
| JP | 2000-349006 | 12/2000 |

OTHER PUBLICATIONS

Kashkoush et al., "A Novel Method for Photoresist Stripping Using Ozone/De-Ionized Water Chemistry", IEEE 1997, pp. 81–84.

* cited by examiner

*Primary Examiner*—Alan Mathews
(74) *Attorney, Agent, or Firm*—Leydig, Voit & Mayer, Ltd.

(57) ABSTRACT

An apparatus for removing a photoresist film includes a substrate cassette for fixing a substrate having a surface covered with a photoresist film, an ozone feed tube for supplying ozone, a liquid feed tube for supplying a liquid photoresist film removing solution, and a processing tank for recovering and processing at least one of ozone and the liquid photoresist film removing solution, wherein the liquid photoresist film removing solution is supplied through the liquid feed tube as a liquid or mist, at least one of ozone and the photoresist film removing solution being continuously supplied.

6 Claims, 8 Drawing Sheets

Standard pattern

Particular pattern

APPARATUS FOR REMOVING PHOTORESIST FILM

This disclosure is a division of U.S. patent application Ser. No. 09/614,258 filed Jul. 12, 2000, now U.S. Pat. No. 6,517,999, which is a continuation application of PCT international application No. PCT/JP99/06323, which has an international filing date of Nov. 12, 1999, and which designated the United States, the entire contents of which are incorporated by reference.

FIELD OF THE INVENTION

The present invention relates to a method of removing a film containing an organic composition and, more particularly, to a method of removing a photoresist film containing an organic polymer compound used in a photolithographic process for producing a semiconductor device and the like, and to an apparatus used in the method.

DESCRIPTION OF THE RELATED ART

A photoresist material is generally used in a photolithographic process for forming a fine pattern and/or in a subsequent etching step for forming an electrode pattern in course of manufacturing a semiconductor device, such as an integrated circuit, a transistor, a liquid crystal device, a diode and the like.

For example, when a silicon oxide layer is formed in a desired pattern on a semiconductor substrate such as a silicon substrate (referred to as a silicon wafer), a silicon oxide layer is first deposited on the surface of the substrate and cleaned before a photoresist material suited for forming the desired pattern is applied to the silicon oxide layer to form a photoresist film. Then, a photo mask having a pattern corresponding to the desired pattern is placed on the photoresist film, exposed to light and then developed. Thereby, a photoresist film having the desired pattern, referred to a photoresist pattern, is obtained. In the subsequent etching step, the silicon oxide layer is removed according to the resulting photoresist pattern. Finally, after the removal of the remaining photoresist film and the cleaning of the surface of the substrate, the silicon oxide layer is remained on the substrate in the desired pattern.

In the etching step, an art-known method of removing a part of the photoresist film unnecessary for the formation of the desired pattern includes, for example, [1] a method using an oxygen gas plasma and [2] a method using various oxidizing agents.

In the method using an oxygen gas plasma [1], oxygen gas is introduced in the photoresist film under vacuum and a high voltage generates an oxygen gas plasma. Then, the photoresist film is decomposed and removed by reacting with the oxygen gas plasma. However, there had been some problems in this method [1], including the requirement of an expensive apparatus for generating the oxygen gas plasma, a potential of damaging the substrate containing an electrical element due to the presence of charge carriers in the plasma, and the like.

Alternatively, as an example of the method [2] using various oxidizing agents to decompose and remove the photoresist film, for example, a method using hot concentrated sulfuric acid or a mixture of hot concentrated sulfuric acid and hydrogen peroxide as the oxidizing agent is known.

When using hot concentrated sulfuric acid, however, there is a disadvantage, such as an extremely high risk of heating strong sulfuric acid to 150° C.

On the other hand, when using the mixture of hot concentrated sulfuric acid and hydrogen peroxide, a substance having an oxidizing and decomposing action is released according to the following scheme. In the scheme, on adding hydrogen peroxide to hot concentrated sulfuric acid heated to about 140°C., peroxosulfuric acid ($H_2SO_5$; generally referred to as Caro's acid) and oxygen atom (O) are generated as follows:

(1)

(2)

The organic photoresist film may be oxidized by the strong acidity of both peroxosulfuric acid and oxygen atoms and converted to an inorganic substance. The inorganic substance is decomposed by reacting with hot concentrated sulfuric acid and then removed from the surface of the substrate.

However, as shown in the above schemes (1) and (2), this method [2] has a problem that, since a sulfuric medium is diluted with water produced upon addition of hydrogen peroxide to hot concentrated sulfuric acid, the concentration of hot concentrated sulfuric acid after mixing is decreased with time. The method [2] also has disadvantages, including the extremely high risk as described for the method [1], i.e., the use of strong sulfuric acid at an elevated temperature, and the heat generated when mixing hot concentrated sulfuric acid with hydrogen peroxide, and the necessity of an expensive exhaust system generating strong ventilation in order to operate the method in a clean room, and the like.

As another oxidizing agent used to decompose the photoresist film other than hot concentrated sulfuric acid, there has been developed a water-immiscible solution for exclusively removing a photoresist film, such as, for example, a solution #106 consisting of 30% by volume of dimethylsulfoxide and 70% by volume of monoethanolamine. However, such oxidizing agent has problems, including its lower oxidation power than hot concentrated sulfuric acid and a mixture of hot concentrated sulfuric acid and hydrogen peroxide, and the difficulty of treating the foul solution which is immiscible with water.

In order to overcome the problems of the above methods [1] and [2], a method of removing a photoresist film using a mixture of ozone with hot sulfuric acid as the oxidizing agent has been proposed (Japanese Patent Kokai Publication No. Sho 57-180132). This publication discloses a method to decompose and remove the organic substance (i.e. the photoresist film) or the inorganic substance deposited on the substrate or the insulating layer by bubbling an ozone-containing gas in hot sulfuric acid. It also describes a washing apparatus used in the method (the cross sectional view of the apparatus is illustrated in FIG. 8).

The washing apparatus shown in FIG. 8 includes a quartz container 6" filled with hot concentrated sulfuric acid 5' heated at approximately 110 ° C., which is laid on a heater 11 and a quartz tube 120 having plural outlets 3'. A raw gas (generally, oxygen) supplied through a gas-introducing tube 111 provided outside the quartz container 6" is converted to an ozonized gas in an ozone generator 1. The ozonized gas is then injected through the quartz tube 120 into hot concentrated sulfuric acid 5' in the quartz container 6 to react with sulfuric acid, and thereby, peroxosulfuric acid and an oxygen atom are produced. By oxidizing the photoresist film with the strong acidity of both peroxosulfuric acid and oxygen, the photoresist film on the surface of the substrate 8 (held with a substrate cassette 9), which is immersed in hot concentrated sulfuric acid, is removed.

In the method described in this publication, the concentration of the sulfuric acid does not change since water is not generated during the decomposition of the photoresist film, and, therefore, frequency of changing the sulfuric acid may be decreased. The method, however, had a problem that the cost for raw materials is too high because a large amount of the sulfuric acid is needed to operate. Additionally, the method and apparatus disclosed in the publication also have a high risk on working because of the use of strong sulfuric acid at an increased temperature in the same way as the conventional method, and also needs extremely strong ventilation since the oxidizing agent is vaporized by bubbling of the ozonized gas.

Accordingly, an object of the present invention is to provide a method of removing a photoresist film at an increased rate, which decreases both usage of the raw materials and the cost for the exhaust system and is also environment-friendly, and to further provide an apparatus used in the method, in order to overcome the above problems with the art-known method for removing the photoresist film and with the conventional apparatus used therefor.

Definition of the Technical Terms

As used herein, an "ozonized gas" means a gas mixture containing oxygen and a given amount of ozone. Hereinafter, a "sealed system" is thermodynamically classified into an open system, but it means one in which any of a gas and a solution are introduced therein and a gas or a vapour generated in removing a photoresist film according to the present invention, and the like, are not released or spattered outside of the system.

SUMMARY OF THE INVENTION

According to the first aspect of the present invention, there is provided a method of removing a photoresist film provided on a surface of a substrate, comprising steps of in a sealed system, disposing the substrate surface having the photoresist film to contact with a photoresist film removing solution, making ozone exist in gas phase and/or solution phase in the vicinity of the liquid surface of the photoresist film removing solution, and changing a relative position between the surface of the substrate and the liquid surface of the solution to decompose or remove the photoresist film from the substarate, characterized in that the relative position is changed continuously or intermittently within a range between a position where a bottom edge of the substrate is present above the liquid surface of the solution, and another position where a top edge of the substrate is present below the liquid surface of the solution.

The photoresist film removing solution used in the present invention may be a solution which is able to dissolve a desired quantity of ozone, and may be selected from a group consisting of pure water, an acid and alkaline aqueous solutions and an organic solvent. According to the method of the present invention, ozone and the photoresist film removing solution may be simultaneously or separately supplied into a sealed system. Alternatively, ozone and the photoresist film removing solution may also be supplied simultaneously by incorporating ozone into the photoresist film removing solution.

In the method of the present invention, the relative position between the surface of the substrate and the liquid surface of the photoresist film removing solution can be controlled by the way of:

(1) moving the substrate itself; or (2) changing a level of the liquid surface of the photoresist film removing solution.

The moving and changing may be continuously or intermittently conducted.

According to the method of the present invention, the photoresist film removing solution may be used in a mixed phase prepared by incorporating a given amount of ozone therein. It may be also possible to apply ultrasonic vibration into the sealed system.

Another method of the present invention includes a step of continuously or intermittently supplying the surface of the substrate having the photoresist film thereon with an ozonized gas and the photoresist film removing solution in a form of mist. In this method, ozone and the photoresist film removing solution may be simultaneously supplied by using the photoresist film removing solution which incorporates ozone therein.

According to the method of the present invention, the photoresist film removing solution which has been used in the system may be recovered and conditioned for reuse.

According to the second aspect of the present invention, there is provided an apparatus for removing a photoresist film from a substrate used in a method of removing the photoresist film provided on a surface of the substrate, comprising steps of in a sealed system, disposing the substrate surface having the photoresist film to contact with a photoresist film removing solution, making ozone exist in gas phase and/or solution phase in the vicinity of the liquid surface of the photoresist film removing solution, and changing a relative position between the surface of the substrate and the liquid surface of the solution to decompose or remove the photoresist film from the substarate, the relative position is changed continuously or intermittently within a range between a position where a bottom edge of the substrate is present above the liquid surface of the solution, and another position where a top edge of the substrate is present below the liquid surface of the solution, wherein the apparatus comprising a reaction vessel for charging a photoresist film removing solution, an ozone feed tube having an outlet for injecting ozone into the photoresist film removing solution, a substrate cassette for disposing and fixing the substrate to contact with a liquid surface of the photoresist film removing solution, a cassette carrier unit for moving the substrate cassette and a processing tank for recovering and processing ozone and/or the photoresist film removing solution. According to the apparatus of the present invention, ozone and the photoresist film removing solution can be simultaneously or separately supplied into the reaction vessel.

In the apparatus of the present invention, the relative position between the surface of the substrate and the liquid surface of the solution may be optionally changed within the range from a position where a bottom edge of the substrate is present above the liquid surface of the solution and another position where a top edge of the substrate is present below the liquid surface of the solution, by continuously or intermittently moving the cassette carrier unit, or by continuously or intermittently controlling the supplement of the photoresist film removing solution into the reaction vessel and the discharge thereof from the reaction vessel.

In the apparatus of the present invention, in case of the supply and discharge of the photoresist film removing solution supply, the reaction vessel may have an automatically operated valve for changing a level of the liquid surface of the photoresist film removing solution.

The apparatus of the present invention further comprises an ultrasound generator. In this case, the removing solution used in the apparatus is preferably supplied in a mixed phase containing ozone, wherein the solution is free from bubbles.

The present invention also provided an apparatus for removing a photoresist film, comprising a substrate cassette for fixing a substrate having a photoresist film on a surface of the substrate, an ozone feed tube, a liquid feed tube for supplying the photoresist film removing solution and a processing tank for recovering and processing ozone and/or the photoresist film removing solution. The photoresist film removing solution supplied through the liquid feed tube may be in a form of liquid or mist, while ozone and the photoresist film removing solution may be continuously or intermittently supplied. The reaction vessel has a means for reusing or discharging the photoresist film removing solution and/or ozone.

PREFERRED EMBODIMENTS OF THE INVENTION

A method of the present invention and an apparatus used in the method will be described in detail below by way of preferred embodiments. It should be noted, however, that the present invention is not limited to these embodiments, and various changes and modifications that are apparent for those skilled in the art are within the scope of the present invention.

Embodiment 1

The embodiment 1 relates to a method of removing a photoresist film using an apparatus for removing a photoresist film (A1, FIG. 1) as the second aspect of the invention.

In the present application, the photoresist film to be removed may include either a film formed from a photoresist material containing an organic polymer compound, which the photoresist material is used in any processes of manufacturing semiconductor devices, a film decomposed by heating, a film of which the surface is modified by heating or heavy doping, or a film having a surface on which an inorganic substance is deposited in an etching process.

The substrate of which the surface has the photoresist film may include silicon wafer, a glass substrate for a liquid crystal display device, a glass-reinforced epoxy substrate used for producing a printed-circuit, and the like, but is not particularly limited thereto as long as it may be any one commonly used in the manufacture of semiconductor devices.

Apparatus

Figure 1:
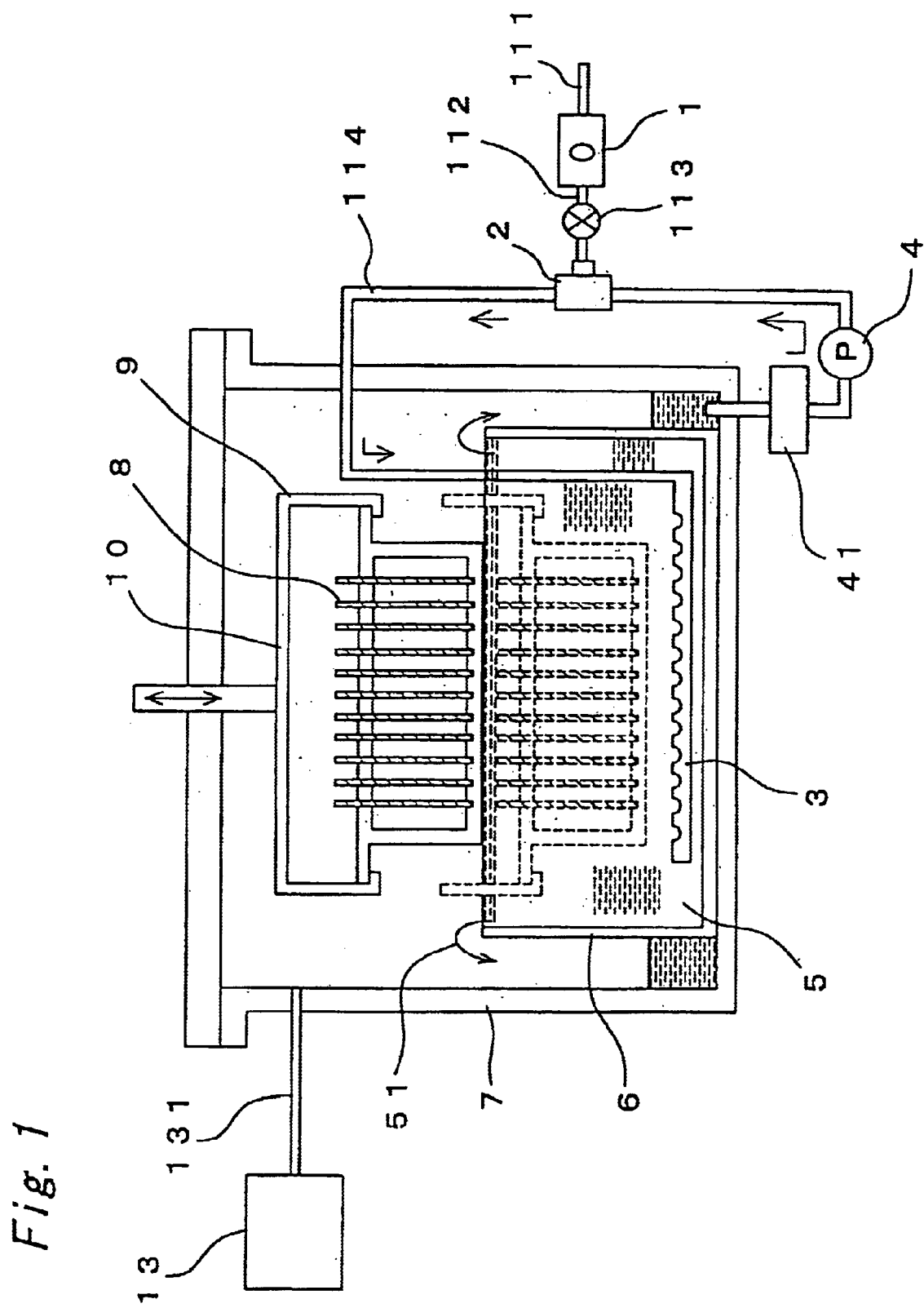
FIG. 1 schematically shows a cross-sectional view illustrating an apparatus for removing a photoresist film according to the present invention.

An apparatus (A1) of the present invention shown in FIG. 1 is operated roughly as follows. First, a raw gas mainly containing oxygen is supplied through an ozone gas feed tube 111 to ozonize at least 5 mole %, preferably from 5 to 100 mole % of the raw gas on an ozone generator 1. In this specification, the gas containing ozone will be called the "ozonized gas" for simplicity, hereinafter.

A content of ozone in the ozonized gas may change depending on the size of the substrate to be processed and the type of the photoresist material used. An amount of the gas containing oxygen which is supplied to the ozone generator 1 may change depending on the necessary content of ozone in the ozonized gas.

The resulting ozonized gas is mixed in an ejector 2 with a photoresist removing solution supplied through a pump 4, to prepare a photoresist removing solution 5 containing the ozonized gas. This solution 5 is introduced through a liquid feed tube 114 into a reaction vessel 6 placed in a sealed container 7.

The apparatus (A1) of the present invention has a check valve 113 installed upstream the ejector 2 in order to prevent the moisture from entering to the ozone generator 1 that would significantly reduce the amount of ozone generated. More preferably, the amount of gas supplied to the ozone generator 1 may be controlled by equipping a detector for detecting the amount of gas to close the check valve 113 when the raw gas is not supplied.

The photoresist film removing solution that can be used in the present invention may be selected from a group consisting of pure water; an acid aqueous solution, such as sulfuric acid, hydrochloric acid, nitric acid, acetic acid and hydrogen peroxide; an alkaline aqueous solution, such as ammonium hydroxide; an organic solvent, such as ketones including acetone and the like, and alcohols including isopropanol and the like; and a mixture thereof. Although pure water may be most preferably used in view of waste water treating and the like, any of the above solvents other than pure water or a mixture thereof may be desirably used when it is intended to increase a rate of removing the photoresist film, or to remove the modified film by heavy ion doping or contaminants deposited on the surface of the substrate.

An amount of ozone in the photoresist removing solution containing the ozonized gas used in the apparatus (A1) of the present invention is in the state of saturation, and may preferably be in a range from 10 to 200 ppm at 20° C. The amount may be varied by controlling the content of ozone contained in the ozonized gas.

An excess amount of the photoresist removing solution containing the ozonized gas 5 is overflown (arrow 51 in FIG. 1) from the reaction vessel 6, recovered in the sealed container 7 and then recycled through a filter 41 to reuse.

Unnecessary ozonized gas after processing is carried through an ozone outlet tube 131 to a waste ozone processor 13 to reduce to oxygen, and then is discharged to the atmosphere.

Accordingly, since removing the photoresist film is conducted in the sealed container, the apparatus of the present invention may not release harmful gas to the atmosphere while there is no necessary for an elaborate ventilation facility. The apparatus of the present invention may also reduce the amount of starting materials since the solution used can be recycled to reuse after the operation.

When the apparatus (A1) of the present invention is used to process a substrate 8 having the photoresist film on the surface thereof, the substrate 8 is fixed in a substrate cassette 9 in a predetermined direction. In the substrate cassette 9, a fixing means (such as a groove) may be provided so that a desired number of substrates to be processed at the same time can be held in parallel to each other, each substrate being apart from at a proper interval. The substrate cassette 9 can be moved up and down in the sealed container 7 with moving a cassette carrier unit 10 to which the substrate cassette 9 is fixed.

Moving the substrate cassette 9 up and down is most preferably conducted at the angle to arrange the surface of the substrate substantially normal to the liquid surface of the photoresist removing solution. However, in the present invention, the angle is not particularly limited thereto, as long as the surface of the substrate may be effectively in contact with the liquid surface of the photoresist removing solution.

In FIG. 1, the substrate 8, the substrate cassette 9 and the cassette carrier unit 10, all of which are drawn with solid lines, depict the state where the substrate is brought to the top position (i.e. a position where a bottom edge of the substrate is present above the liquid surface) by the cassette carrier unit 10, and those drawn with dashed lines depict the state where the substrate is brought to the bottom position (i.e. a position where a top edge of the substrate is present below the liquid surface). According to the present invention, the substrate to be processed is subjected to at least one pass of a movement, each pass being consisting of the motion from the top position to the original top position through the bottom position. The substrate may move either continuously or discontinuously (that is intermittently).

Process of Removing Photoresist Film

The process of removing a photoresist film according to the method of the present invention, including the vertical movement of the substrate, will be described in detail with reference to a conceptual diagram of FIG. 2.

Figure 2:
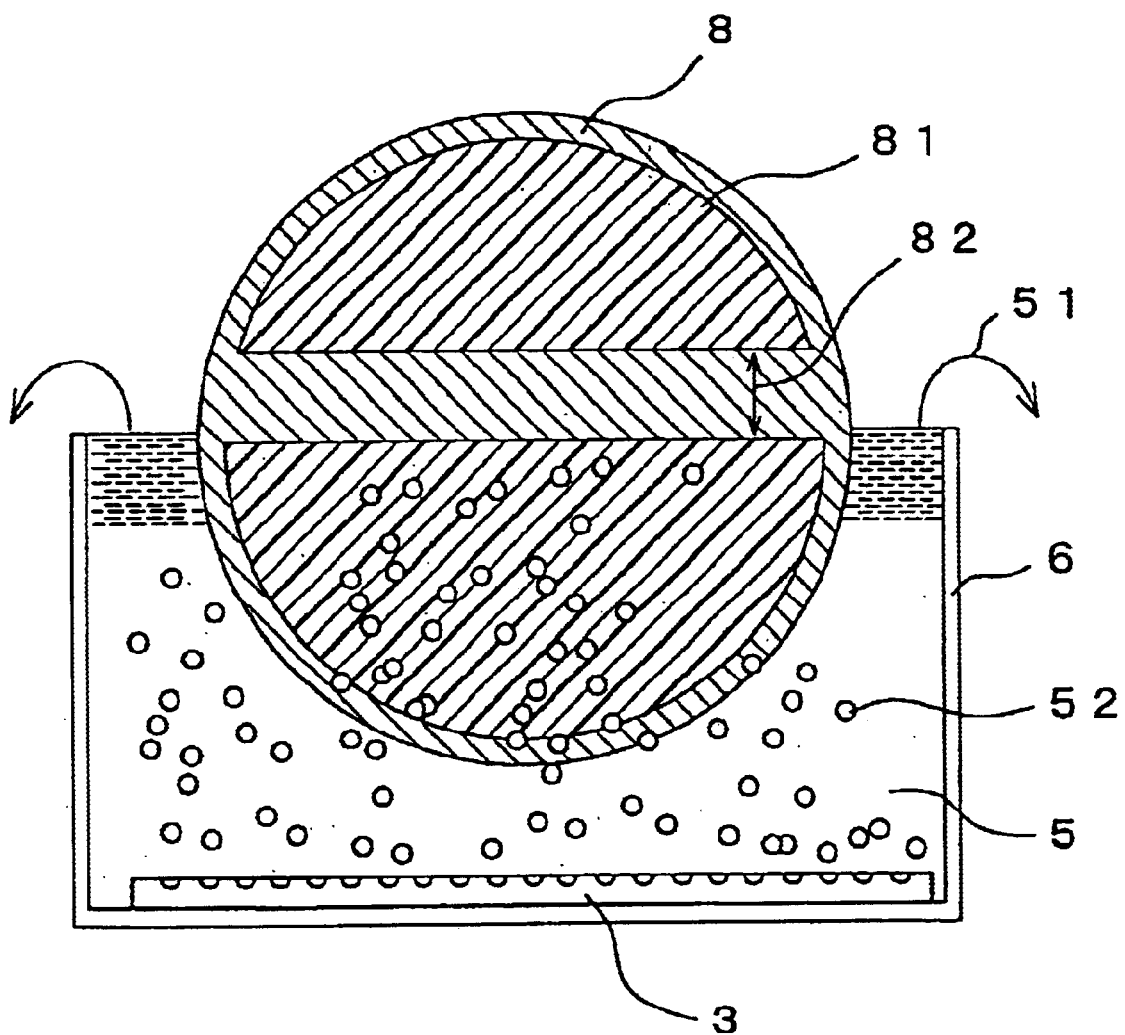
FIG. 2 conceptually shows a diagram illustrating the process of removing a photoresist film in a method of removing a photoresist film of the present invention.

In FIG. 2, the substrate 8, having a photoresist film 81 on a surface thereof, is immersed up to a half surface from its bottom end in the photoresist film removing solution containing the ozonized gas 5. When pure water was used as the photoresist film removing solution, and the ozonized gas was incorporated into pure water to obtain a mixture containing 50 ppm of ozone at 20° C., a rate to remove the photoresist film in the mixture by the oxidization and the decomposition was within a range from about 0.04 to about 0.08 $\mu$m/min.

In the photoresist film removing solution containing the ozonized gas 5, the photoresist film 81 on the surface of the substrate 8 is coated by the solution 5, resulting in a reduced diffusion rate of ozone. As a result, the photoresist film 81 coated by the solution 5 is decomposed to some extent to make the molecular of the organic composition formulated in the film lower, but then, the oxidation does not effectively proceed. On the other hand, in a region near a gas-liquid interface 82 between the liquid surface of the photoresist film removing solution containing the ozonized gas 5 and the atmosphere (i.e. the region within about 1 cm above the liquid surface), there exists ozone in a high concentration, and it can be supplied to the photoresist film 81 coated by the film of the solution 5, and thereby, the photoresist film can make contact with far more ozone in this region than in the solution. Near the gas-liquid interface 82, the photoresist film 8 can be oxidized and decomposed at a rate several times faster than the rate described above.

Further, bursting bubbles containing ozone (number 52 in FIG. 2) in air produce the ozone-incorporating pure water surrounding the bubbles deposited on the substrate. The present inventors have found that when the ozone-incorporating pure water, i.e., the photoresist removing solution containing the ozonized gas, deposited on the substrate flows down by gravity, it also has an action of washing down the lower molecular weight organic composition formulated in the film (namely, cleaning action).

Figure 3A:
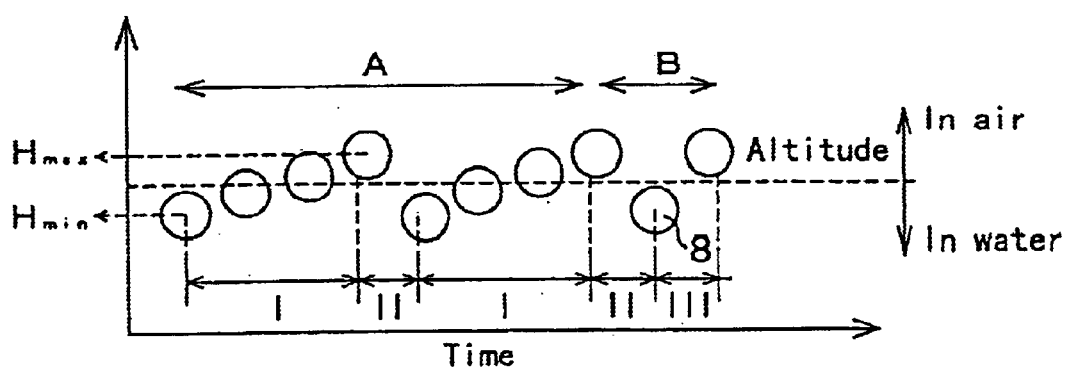
FIGS. 3(a) and 3(b) conceptually show a diagram illustrating the relative position between the surface of the substrate and the liquid surface of the photoresist film removing solution versus a period of time taken to remove a photoresist film in a method of removing a photoresist film according to the present invention.

In the apparatus (A1) of this embodiment where the substrate 8 itself is moved, when moving the substrate 8 upward from within the photoresist film removing solution containing the ozonized gas 5, the substrate moves at a constant speed (preferably from 1 to 100 cm/min.) from the position of H min to the position of H mix (region I), as shown in FIG. 3(a). This makes the photoresist film removing action which brings about near the gas-liquid interface effective over the whole of the substrate.

The movement may be continuously or intermittently conducted. That is, the substrate may move continuously at a constant speed, or it may move each given relative position between the surface of the substrate and the liquid surface of the solution at certain time intervals (preferably each 1 to 10 cm every 0.5 to 10 minutes).

When in the apparatus (A1), the substrate 8 moves downward to immerse in the photoresist film removing solution containing the ozonized gas 5, it may move faster than the upward movement (for example at 10 cm/min or faster, most preferably at between 10 and 1000 cm/min) (region II in FIG. 3(a)). When the substrate 8 is immersed in the solution 5 at a faster speed, it may cause a friction force between the photoresist film 81 and the liquid surface of the solution 5, and thereby, it may peel off or dissolve even the remaining photoresist film having a relatively large molecular weight in the solution.

Then, the remaining photoresist film having the relatively large molecular weight which is present or dissolved in the photoresist film removing solution containing the ozonized gas 5 may be oxidized or decomposed in the solution, or it may be recovered in the sealed container 7 and then collected on the filter 41. When a heating unit is installed on the filter 41, the remaining photoresist film can be more efficiently decomposed, and thereby, the frequency of changing the photoresist film removing solution containing the ozonized gas 5 may be reduced.

In this embodiment, the substrate may move up and down at least one pass as described hereinbefore.

At last of the process according to the present invention, when the substrate lifts quickly from within the photoresist film removing solution containing the ozonized gas 5, the photoresist film can readily peel off, and thereby, the subsequent step of cleaning of the substrate may be conducted more efficiently (region III in FIG. 3(a)).

Figure 3B:
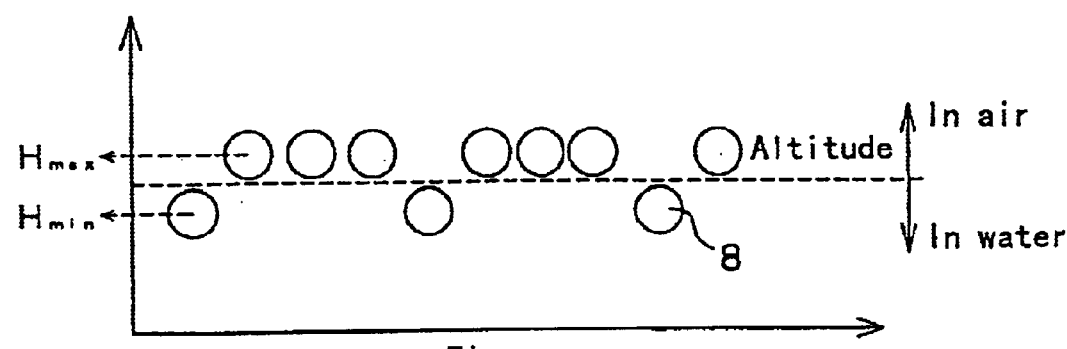

According to the method and the apparatus of the present invention, the substrate may be moved discontinously (i.e. intermittently) as shown in FIG. 3(b). For instance, after holding the substrate 8 in the ozonized gas for 0.5 to 2 minutes, the substrate 8 may be immersed in the photoresist film-removing solution containing the ozonized gas 5 for 10 seconds to one minute. The movement of the substrate from air into the solution 5 may be particularly effectively conducted after the solution remaining on the surface of the substrate is dried.

According to the present invention, when the process may include a step of rapidly moving the substrate vertically during the movement the substrate 8 up and down, it may make the photoresist film easier to peel off, and therefore, the rate to remove the film may be increased.

While the rate to remove the photoresist film may change depending on the photoresist material used for the process and on the method of processing the film in this embodiment, the rate to remove the film is between about 0.1 and 5 µm/min as measured. The rate shows that the method of the present invention may improve the process of removing the film several times more effectively compared with the art-known method.

Embodiment 2

Figure 4:
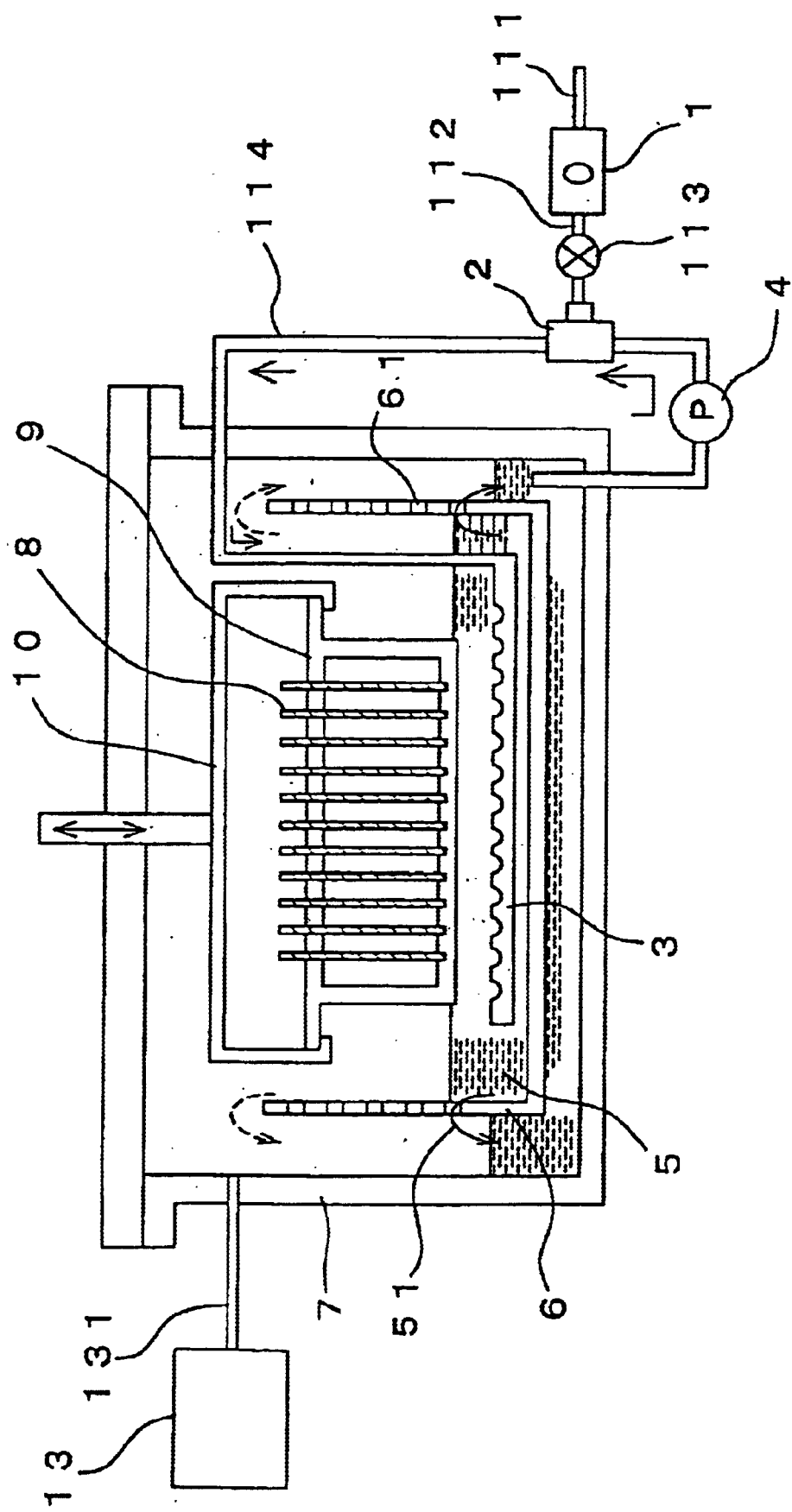
FIG. 4 schematically shows a cross-sectional view of an apparatus for removing photoresist film according to the present invention.

The above embodiment 1 illustrates the method and the apparatus of moving the substrate itself in order to change the relative position of the surface of the substrate and the liquid surface of the solution. The present invention, however, also provides another method and apparatus which can change the liquid surface of the photoresist film removing solution to control the relative position. FIG. 4 shows an apparatus which is able to change the liquid surface of the solution to control the relative position.

The apparatus (A2) shown in FIG. 4 has a constitution typically similar to that of the apparatus (A1) shown in FIG. 1 (that is, the raw gas is a oxygen-containing gas, and any of the photoresist film removing solution described in embodiment 1 may be used). In the apparatus (A2) of embodiment 2, however, it is not essential to move the substrate 8 vertically using the cassette carrier unit 10 in the sealed container 7. An automatically operated valve 61 is equipped with the reaction vessel 6 in the sealed container 7 to control the liquid surface of the photoresist film removing solution containing the ozonized gas 5. The automatically operated valve 61 may be installed in any walls or in the bottom of the reaction vessel 6.

The rate to change the liquid surface of the photoresist film removing solution containing the ozonized gas 5 using the automatically operated valve 61 may be similar to the rate to move the substrate 8 by means of the cassette carrier unit 10 described in above embodiment 1. If necessary, the liquid surface may be changed either continuously or intermittently.

The rate to change the liquid surface of the photoresist film removing solution containing the ozonized gas 5 is preferably controlled by making reference to the above description related to FIGS. 3(a) and 3(b).

Embodiment 3

The present invention also provides a different method and apparatus other than those described above embodiments 1 and 2, further including an ultrasound generating means in the apparatus, and applying ultrasonic vibration to the photoresist film removing solution containing the ozonized gas and the substrate using the ultrasound generating means, in order to improve the efficiency of the process capacity.

Figure 5:
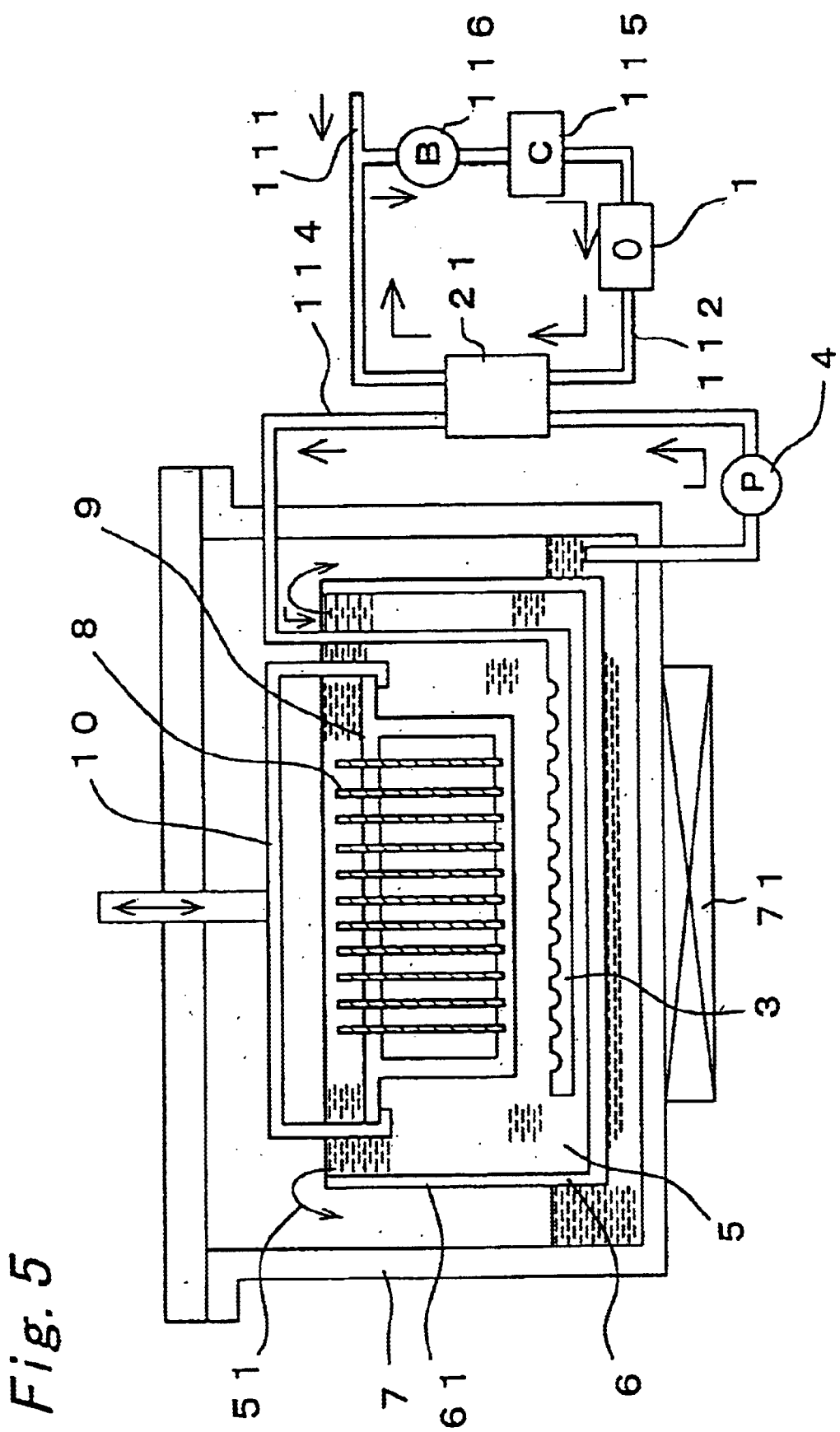
FIG. 5 schematically shows a cross-sectional view of an apparatus for removing a photoresist film according to the present invention.

FIG. 5 illustrates an example of an apparatus of removing a photoresist film (A3) used in this embodiment 3, wherein most of the apparatus may be the same as that described in this embodiment 1, with the exception of an element and a function specifically described).

The ultrasound generating means 71 used in the apparatus (A3) of the embodiment 3 may be one that is well known in the prior art. The ultrasound generating means 71 is laid adjacent to the bottom of the sealed container 7 in FIG. 5, but is not limited thereto. As long as the ultrasonic vibration can be effectively applied to both the photoresist film removing solution containing the ozonized gas 5 and the substrate 8, the ultrasound generating means 71 may be installed, for example, on the bottom of the reaction vessel.

In FIG. 5, first, the raw gas (i.e. an oxygen-containing gas; not indicated in FIG. 5) is sent to the ozone generator 1 from the ozone gas feed tube 111 through a blower 116. The gas, a part of which has been ozonized, is supplied to a membrane type dissolution module 21 and is mixed with the solution supplied by the pump 4 to obtain the photoresist film removing solution containing the ozonized gas 5. This solution is supplied through the liquid feeder tube 114 and injected from the outlet 3 into the reaction vessel 6 in the sealed container 7. Excess gas that has not been dissolved in the solution 5 is circulated to pass through the blower 116 and the ozone generator 1 to send to the membrane type dissolution module 21 again. When the circulating gas contains some moisture, the efficiency of the generation of ozone on the ozone generator 1 may decrease with time. In this embodiment 3, since a cooling dehumidifier 115 is installed between the blower 116 and the ozone generator 1 to remove the moisture, the efficiency of the generation of ozone on the ozone generator 1 may be prevent from decreasing with time.

The substrate 8 may be completely immersed in the reaction vessel 6 filled with the photoresist film removing solution containing the ozonized gas 5. When the ultrasound generating means 71 works, the ultrasonic vibration is reached to both the photoresist film removing solution containing the ozonized gas 5 and the substrate 8. The vibration breaks the coating made of the solution 5 covering the photoresist film on the substrate 8. Thereby, the frequency with which the photoresist film may contact with the photoresist film removing solution containing the ozonized gas 5 may be increased, and then, the rate to remove the photoresist film may significantly increase.

Embodiment 4

The embodiment 4 describes a method of supplying ozone and the photoresist film removing solution separately, and further describes an apparatus (A4) used for the method.

Figure 6:
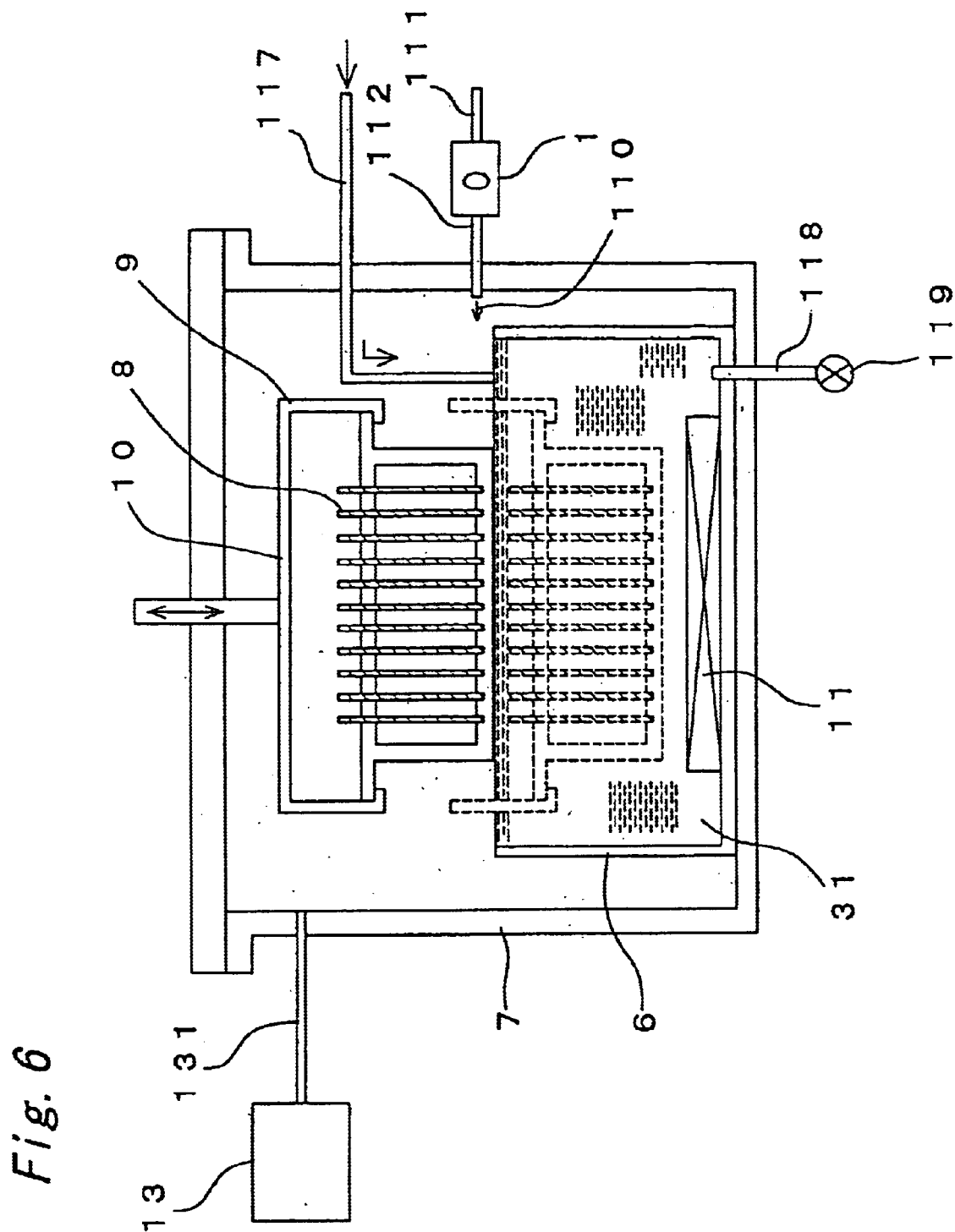
FIG. 6 schematically shows a cross-sectional view of an apparatus for removing a photoresist film according to the present invention.

FIG. 6 illustrates an apparatus of removing a photoresist film (A4), equipped with in the sealed container 7, the reaction vessel 6 which is charged with the photoresist film removing solution 31, the cassette carrier unit 10 for vertically moving the substrate 8, and feeder tubes 112 and 117 for separately supplying the photoresist film removing solution 31 and the ozonized gas 110 from the outside into the sealed container. Since the ozonized gas 110 is not mixed with the photoresist film removing solution 31, but is supplied directly from the ozone generator 1 through the ozone gas feed tube 112 into sealed container 7, ozone can be supplied in high concentration. In this apparatus (A4), it is not necessary to circulate the photoresist film removing solution 31 so that the desired amount of the photoresist film removing solution 31 is supplied through the liquid feed tube 117 when necessary. Most of the apparatus may be the same as that described in this embodiment 1, with the exception of an element and a function specifically described.

In this embodiment 4, first, the substrate 8 is completely immersed in the solution 31. Then, the substrate 8 is lifted completely out of the solution 31 to contact with the ozonized gas 110 supplied apart from the solution 31. This causes the formation of a coating of the solution 31 on the surface of the photoresist film, and thereby, the ozonized gas may readily penetrate into the photoresist film, and the rate to remove the film may be further increased.

An example of the photoresist film removing solution 31 used in the embodiment 4 may be any of those described in the above embodiment 1, and more preferably includes isopropyl alcohol in view of its easier formation of the coating of the solution film on the surface of the photoresist film easier and its ready evaporation.

In the embodiment 4, the photoresist film removing solution may be heated using a heating means (11 in FIG. 6) conventionally employed in the art in order to increase the rate to decompose the photoresist film and to accelerate the evaporation of the coating of the solution film on the surface of the substrate. By installing the heating means, while the remaining photoresist film on the surface of the substrate, having the decreased molecular weight by the decomposition or the peeling off, can be more efficiently decomposed, the frequency of changing the solution can be also reduced. In this case, the photoresist film removing solution 31 may be heated to any temperature up to 100° C.

Embodiment 5

This embodiment 5 is characterized in that the ozonized gas and the photoresist film removing solution in a form of mist are supplied separately, and either continuously or intermittently.

Figure 7:
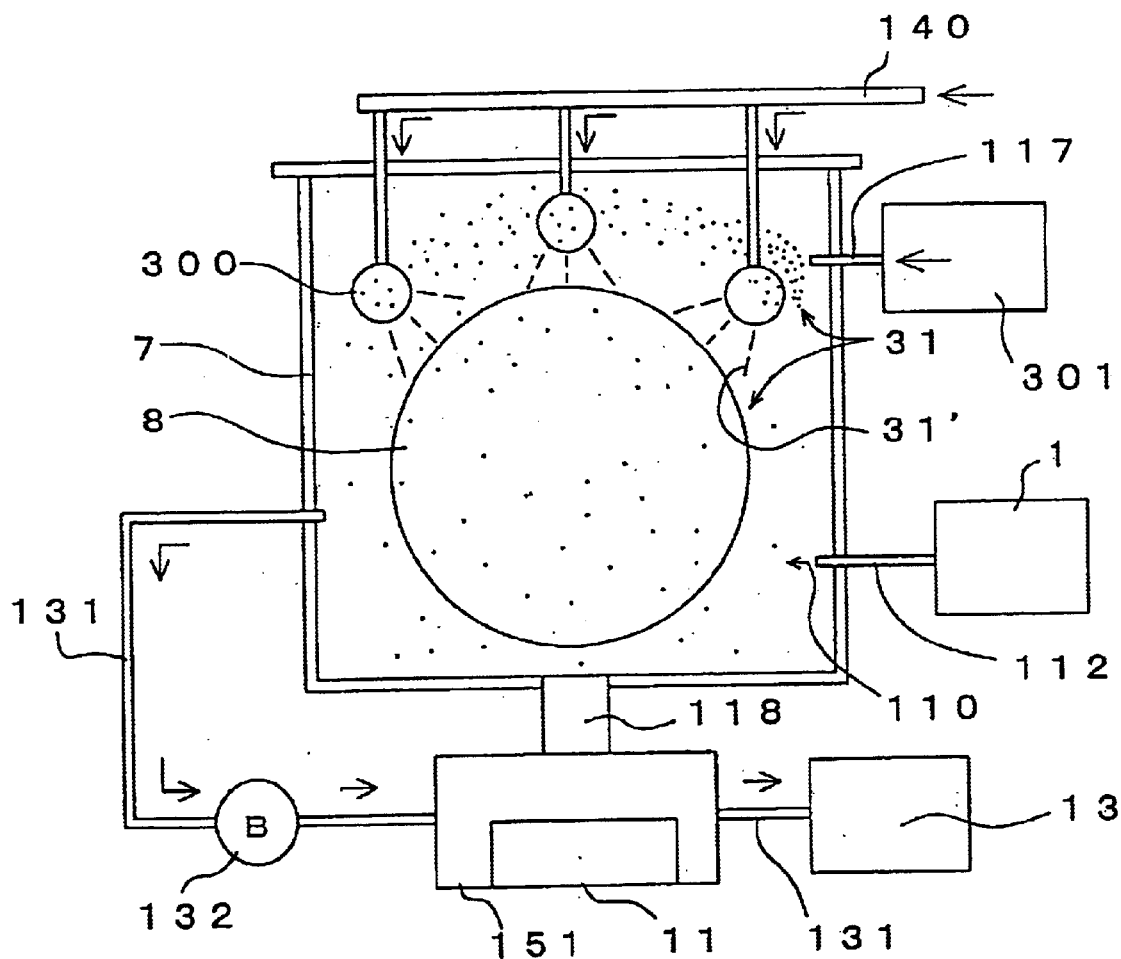
FIG. 7 schematically shows a cross-sectional view of an apparatus for removing a photoresist film according to the present invention.
Figure 8:
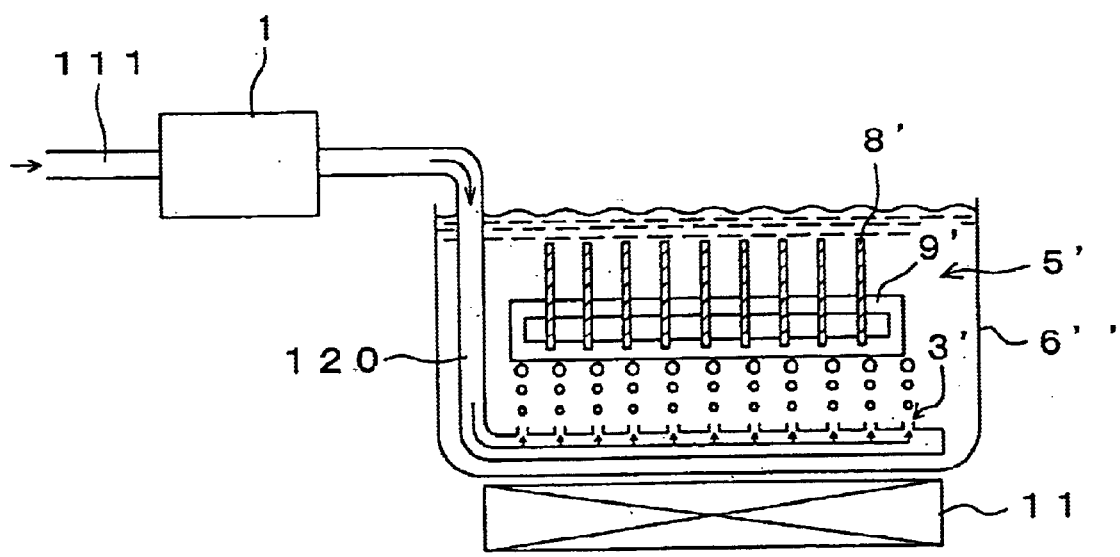
FIG. 8 schematically shows a cross-sectional view of an apparatus for removing a photoresist film described in the background art.

In this embodiment 5, an apparatus for removing a photoresist film (A5) exemplified in FIG. 7 can be used. The apparatus (A5) includes the ozone gas feed tube 112 for supplying the ozonized gas 110 to the sealed container 7, the liquid feed tube 117 for supplying the photoresist film removing solution in the form of mist (for example, number 31 in FIG. 7 indicates the photoresist film removing solution in the form of mist), a liquid injection nozzle 300 for supplying a washing solution in a form of mist (for example, number 31' in FIG. 7 indicates the washing solution in the form of mist) and processing devices 151 and 13 for recovering and processing the excess ozonized gas 110, and/or the photoresist film removing solution 31 and the washing solution 31' which have been used. The substrate 8 is fixed using a proper means (not shown) in the sealed container 7.

In the process of removing the photoresist film using the apparatus (A5), first, the substrate 8 is fixed in the sealed container 7. Then, the photoresist film removing solution 31 is sprayed through a humidifier 301 from the liquid feed tube 117. The photoresist film removing solution 31 used in this embodiment 5 may be the same one as that described in the above embodiment 1. The solution may also be sprayed continuously or intermittently. An amount of the solution to spray may be changed depending on the size of the substrate to be processed and the thickness of the photoresist film.

At the same time of, before or after the spray of the solution, the ozonized gas 110 generated on the zone generator 1 is supplied through the ozone gas feed tube 112 to the sealed container 7.

The photoresist film removing solution 31 in the form of mist, which has been supplied, provides a thin coating on the photoresist film on the surface of the substrate. The photoresist film is subsequently oxidized and decomposed, or peeled off, by the action with ozone existing in the sealed container 7, and then, a photoresist component having low molecular weight that has been decomposed or peeled off, which is remained in the photoresist film, is dissolved in the coating.

When the oxidized and decomposed component dissolves in the coating of the solution, the ozonized gas is consumed to decompose the component dissolved in the coating so that it may be sufficiently reached to the photoresist film on the substrate. Therefore, the surface of the substrate may be preferably washed by spraying a solution having the same formulation as the photoresist film removing solution 31 or pure water as a washing solution from the liquid injection nozzles 300 to the substrate 8 every certain time intervals. Spraying may be preferably intermittently conducted at the same time intervals as those of moving the substrate 8 (for example, sprayed each for 10 seconds to one minute every 0.5 to 2 minutes).

Then, faster removal of the photoresist film can be accomplished by repeating several times a pass of the process, consisting of spraying the solution, oxidizing and decomposing the photoresist film on the substrate by contacting with ozone, and washing the substrate.

An excess of the ozonized gas 110, and the photoresist film removing solution 31 and washing solution 31' which have been used in the process may be discarded or reused after the recovery and/or the process thereof in a processing tank 151 or a waste-ozone processor 13. In order to improve the efficiency of the process, a heating means 11, such as a known heater, may be equipped with the processing tank 151.

All of the methods and the apparatuses according to these embodiments 1 to 5 are accomplished by considering further the disposal of the waste solution and the exhaust gas, and therefore, the extremely fast removal of the photoresist film can be also performed.

Effects of the Invention

According to the method of the present invention, frequency of the contact of ozone with the photoresist film removing solution may be increased by changing the relative position between the surface of the substrate to be processed and the liquid surface of the solution, and thereby, the rate to decompose and remove the photoresist film may be improved.

The photoresist film removing solution used in the invention may be any of known solvents selected from a group consisting of pure water, an aqueous acid and alkaline solutions, and organic solvents, as long as it can dissolve ozone. In the present invention, ozone and the photoresist film removing solution can be supplied simultaneously by incorporating ozone into the photoresist film removing solution, and thereby, the rate to decompose and remove the photoresist film can be further accelerated. The cost of starting material can be readily controlled since each of ozone and the photoresist film removing solution can be also supplied separately.

According to the present invention, the change of the relative position can be performed by moving the substrate up and down in a desired range between a position where the bottom edge of the substrate is present above the liquid surface of the photoresist film removing solution and a position where the top edge of the substrate is present below the liquid surface, or by changeing a level of the liquid surface. This makes it possible to uniformly remove the photoresist film on the whole of the surface of the substrate.

By applying the ultrasonic vibration to the sealed system, the rate for the decomposition and the removal can be further increased.

In the method of the present invention and the apparatus used therefor, when the photoresist film removing solution is used in the form of vapor or mist, reduction of molecular weight of the component remained in the photoresist film may be also accelerated by contacting with the high concentration of ozone. Then, the photoresist film may be washed away with the photoresist film removing solution in the form of mist, and thereby, the rate of the oxidation and the peeling off.

In the apparatus of the present invention, since the processing vessel for recovering and processing the excess of ozone and/or the photoresist film removing solution to discard or reuse after operation may be installed, the amount of the starting material used in the process to remove the photoresist film can be also optimized or minimized.

In addition, since the apparatus of the present invention also equips the processing vessel which is able to convert the excess of ozone and/or the photoresist film removing solution to the harmless gas or solution before the disposal thereof, an adverse effect on the environment is not brought about. Also because the apparatus according to the present invention is operated in the sealed system, a toxic gas or vapor will never be released to the atmosphere even when the materials are used in the form of vapor or mist.

What is claimed is:

1. An apparatus for removing a photoresist film from a substrate by, in a sealed system, placing a substrate having a surface covered with a photoresist film in contact with a liquid photoresist film removing solution, supplying ozone near a surface of the liquid photoresist film removing solution, and cycling relative positions of the surface of the substrate and the surface of the liquid photoresist film removing solution between a first position, $H_{max}$, where a bottom edge of the substrate is above the surface of the liquid photoresist film removing solution, a second position, $H_{min}$, where a top edge of the substrate is below the surface of the liquid photoresist film removing solution, to remove the photoresist film, and back to the first position, wherein the apparatus comprises:

a reaction vessel for holding a liquid photoresist film removing solution, an ozone feed tube having an outlet for injecting ozone into the liquid photoresist film removing solution in the reaction vessel, a substrate cassette for placing the substrate in contact with the surface of the liquid photoresist film removing solution in the reaction vessel, a cassette carrier unit for moving the substrate cassette, and a processing tank for recovering and processing at least one of the ozone and the liquid photoresist film removing solution.

2. The apparatus for removing a photoresist film according to claim 1, wherein relative positions of the surface of the substrate and the surface of the liquid photoresist film removing solution are cycled between the first, second, and first positions continuously, by moving the cassette carrier unit, to remove the photoresist film.

3. The apparatus for removing a photoresist film according to claim 1, wherein relative positions of the surface of the substrate and the surface of the liquid photoresist film removing solution are cycled between the first, second, and first positions intermittently, by moving the cassette carrier unit, to remove the photoresist film.

4. The apparatus for removing a photoresist film according to claim 1, wherein the reaction vessel includes an automatically operated valve for changing a level of the surface of the liquid photoresist film removing solution.

5. The apparatus for removing a photoresist film according to claim 1, comprising an ultrasound generator.

6. The apparatus for removing a photoresist film according to claim 1, wherein the processing tank includes means for at least one of reusing and discharging at least one of the liquid photoresist film removing solution and ozone.

* * * * *